(12) United States Patent
Huat et al.

(10) Patent No.: US 6,544,817 B2
(45) Date of Patent: Apr. 8, 2003

(54) METHOD FOR SAWING A MOULDED LEADFRAME PACKAGE

(75) Inventors: Lee Kock Huat, Ipoh (MY); Chan Boon Meng, Ipoh (MY); Phuah Kian Keung, Ipoh (MY); Lee Huan Sin, Melaka (MY); Cheong Mun Tuck, Ipoh (MY)

(73) Assignee: Carsem Semiconductor SDN. BHD., Perak (MY)

( * ) Notice: Subject to any disclaimer, the term of this patent is extended or adjusted under 35 U.S.C. 154(b) by 0 days.

(21) Appl. No.: 09/887,646

(22) Filed: Jun. 22, 2001

(65) Prior Publication Data

US 2002/0048850 A1 Apr. 25, 2002

(30) Foreign Application Priority Data

Jun. 23, 2000 (MY) ........................................ PI 20002854

(51) Int. Cl.$^7$ .................... H01L 21/44; H01L 21/48; H01L 21/50
(52) U.S. Cl. .................. 438/113; 438/123; 438/124
(58) Field of Search ................. 438/123, 113, 438/460, 124, 125, 106, 111, 112; 251/666, 667, 670, 669, 672, 676

(56) References Cited

U.S. PATENT DOCUMENTS

| 5,008,615 A | * | 4/1991 | Littlebury ................... 29/827 |
| 5,397,915 A | * | 3/1995 | Nose .......................... 257/676 |
| 5,411,920 A | * | 5/1995 | Shibata ........................ 29/827 |
| 5,650,348 A | * | 7/1997 | Pasch .......................... 438/460 |
| 6,006,739 A | * | 12/1999 | Akram et al. ............. 125/23.01 |
| 6,165,818 A | * | 12/2000 | Ichikawa et al. ........... 438/123 |
| 6,307,256 B1 | * | 10/2001 | Chiang et al. .............. 257/668 |

* cited by examiner

*Primary Examiner*—Carl Whitehead, Jr.
*Assistant Examiner*—Timothy Sutton
(74) *Attorney, Agent, or Firm*—Weingarten, Schurgin, Gagnebin & Lebovici LLP

(57) ABSTRACT

The present invention relates to a new method for sawing a moulded leadframe package (1) into individual integrated circuits (11). In the present invention sawing of the moulded leadframe package (1) is done on the leads (13) instead of on the connecting bar (14) resulting in less heat being generated during cutting. This results in higher cutting speed and longer dicing blade life.

1 Claim, 3 Drawing Sheets

METHOD FOR SAWING A MOULDED LEADFRAME PACKAGE

RELATED APPLICATIONS

This application claims priority under 35 U.S.C. §119 from Malaysian patent application serial number PI 20002854, filed Jun. 23, 2000.

FIELD OF THE INVENTION

The present invention relates generally to an improved method for sawing a moulded leadframe package into a plurality of integrated circuit units.

BACKGROUND OF THE INVENTION

An individual integrated circuit or chip is usually formed from a larger base structure known as a moulded leadframe package or commonly called in the art as MLP. The MLP has a plurality of integrated circuit units arranged in rows and columns with the periphery of each integrated circuit unit being rectangular. Typically, the MLP is sawn or "diced" into rectangularly shaped discrete integrated circuits along two mutually perpendicular sets of parallel lines or streets lying between each of the rows and columns thereof. Hence, the separated or singulated integrated circuit unit is commonly referred to as a dice.

One exemplary MLP saw includes a rotating dicing blade mounted to an aluminum hub and attached to a rotating spindle, the spindle being connected to a motor. Cutting action of the dicing blade may be effected by diamond particles bonded thereto, or a traditional "toothed" type dicing blade may be employed. Many rotating MLP saw structures are known in the art. The present method is applicable to any MLP saw construction, so further structures will not be described herein.

MLP in the art usually contain a plurality of substantially identical integrated circuit units arranged in rows and columns. Two sets of mutually parallel streets extending perpendicular to each other over substantially the entire surface of the MLP are formed between each discrete integrated circuit and are sized to allow passage of a dicing blade between adjacent integrated circuits without affecting any of their internal circuitry. A typical MLP sawing operation includes attaching the MLP to a carrier, mechanically, adhesively or otherwise as known in the art, and mounting the carrier on a table of the MLP saw. A dicing blade of the MLP saw is passed through the surface of the MLP, either by moving the dicing blade relative to the MLP, the table of the MLP saw and the MLP relative to a stationary dicing blade, or a combination of both. To dice the MLP, the dicing blade cuts precisely along each street, returning back over (but not in contact with) the MLP while the MLP is laterally indexed to the next cutting location. Once all cuts associated with mutually parallel streets having one orientation are complete, either the dicing blade is rotated 90° relative to the MLP or the MLP is rotated 90°, and cuts are made through streets in a direction perpendicular to the initial direction of cut. Since each integrated circuit on a conventional MLP has the same size and rectangular configuration, each pass of the dicing blade is incrementally indexed one unit (a unit being equal to the distance from one street to the next) in a particular orientation of the MLP. As such, the dicing blade and the software controlling it are designed to provide uniform and precise indexing in fixed increments across the surface of the MLP.

In the present practice, sawing of the MLP is done along a street on a connecting bar that joins a set of leads from one integrated circuit unit to another set of leads of adjacent integrated circuit unit. This practice generates a lot of heat that may cause considerable damage, solder melt and leads delamination have been reported rampant. Also, the excessive heat slows down the sawing process and reduces substantially the life of the dicing blade. Therefore, there arises a need for improved methods of sawing MLP that overcome the above drawbacks of the current practice.

SUMMARY OF THE INVENTION

Accordingly, one aspect of the present invention provides methods for sawing MLP that generate less heat.

Another aspect of the present invention provides methods for sawing MLP that cause less damage to the leads.

Yet another aspect of the present invention provides methods for sawing MLP that are faster and more efficient.

These and other aspects of the present invention are accomplished by,

A method for sawing a moulded leadframe package (1) into individual integrated circuit units (11), said integrated circuit unit (11) having a die-attach pad (12), a plurality of leads (13) and a connecting bar (14), said method comprising;

attaching said moulded leadframe package (1) to a carrier;

mounting said carrier on a table of a dicing saw; and sawing said moulded leadframe package (1) along a street (15), characterized by said street (15) being located on said plurality of leads (13).

BRIEF DESCRIPTION OF THE DRAWINGS

Other aspects of the present invention and their advantages will be discerned after studying the Detailed Description in conjunction with the accompanying drawings in which.

DETAILED DESCRIPTION OF THE INVENTION

Figure 1:
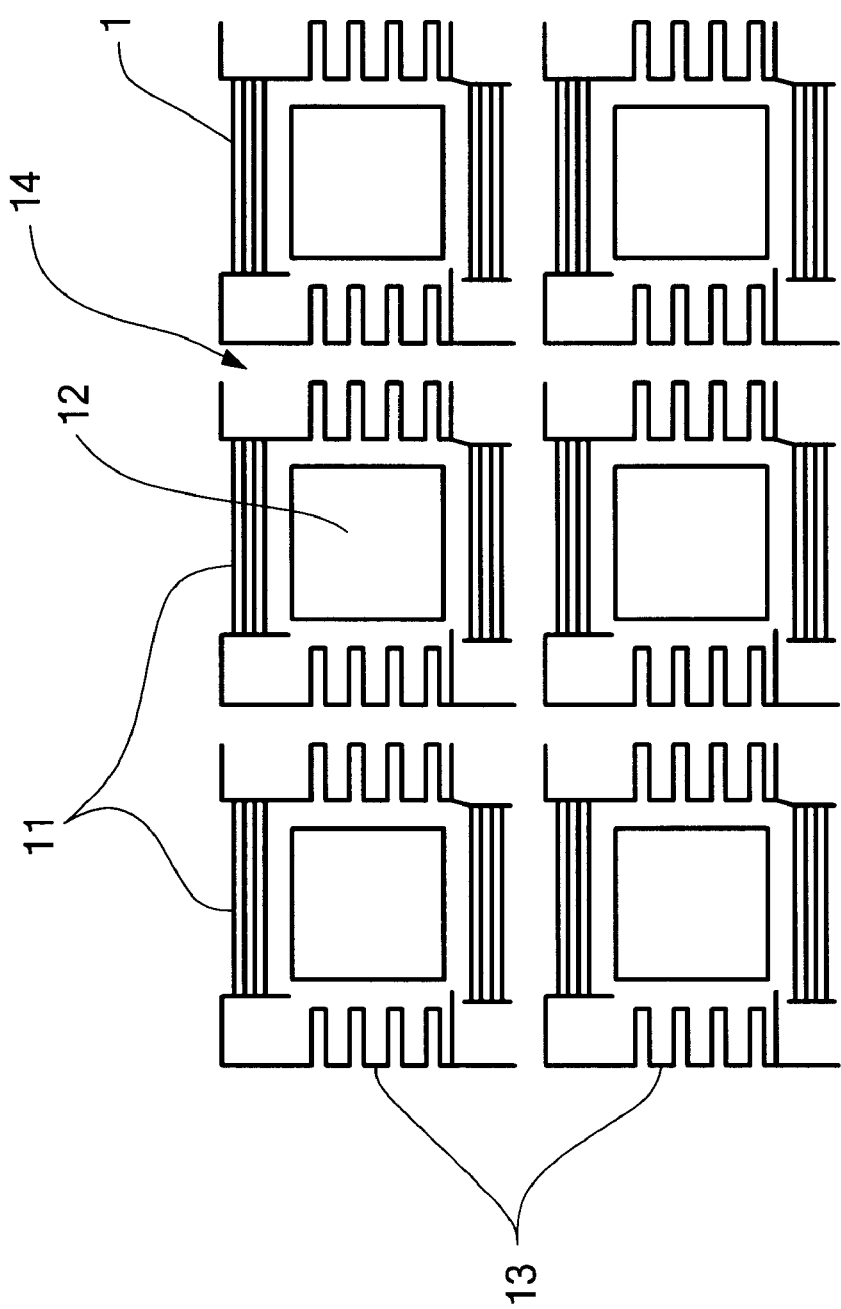
FIG. 1 shows a leadframe having a multiple integrated circuit units.

Referring now to FIG. 1 showing a leadframe having a multiple integrated circuit units, the leadframe (1) comprises a plurality of integrated circuit units (11) having a die-attach pad (12), a plurality of leads (13) and a connecting bar (14). The connecting bar (14) holds together a plurality of leads (13) of one integrated circuit to a plurality of leads of adjacent integrated circuit. In the manufacture of semiconductor, after die-attach, the leadframe is moulded or packaged to form the moulded leadframe package to protect circuitry within the integrated circuit units. The moulded leadframe package is then sawn or diced into individual integrated circuits or chips. The leadframe (1) may be made from a copper base.

Figure 2:
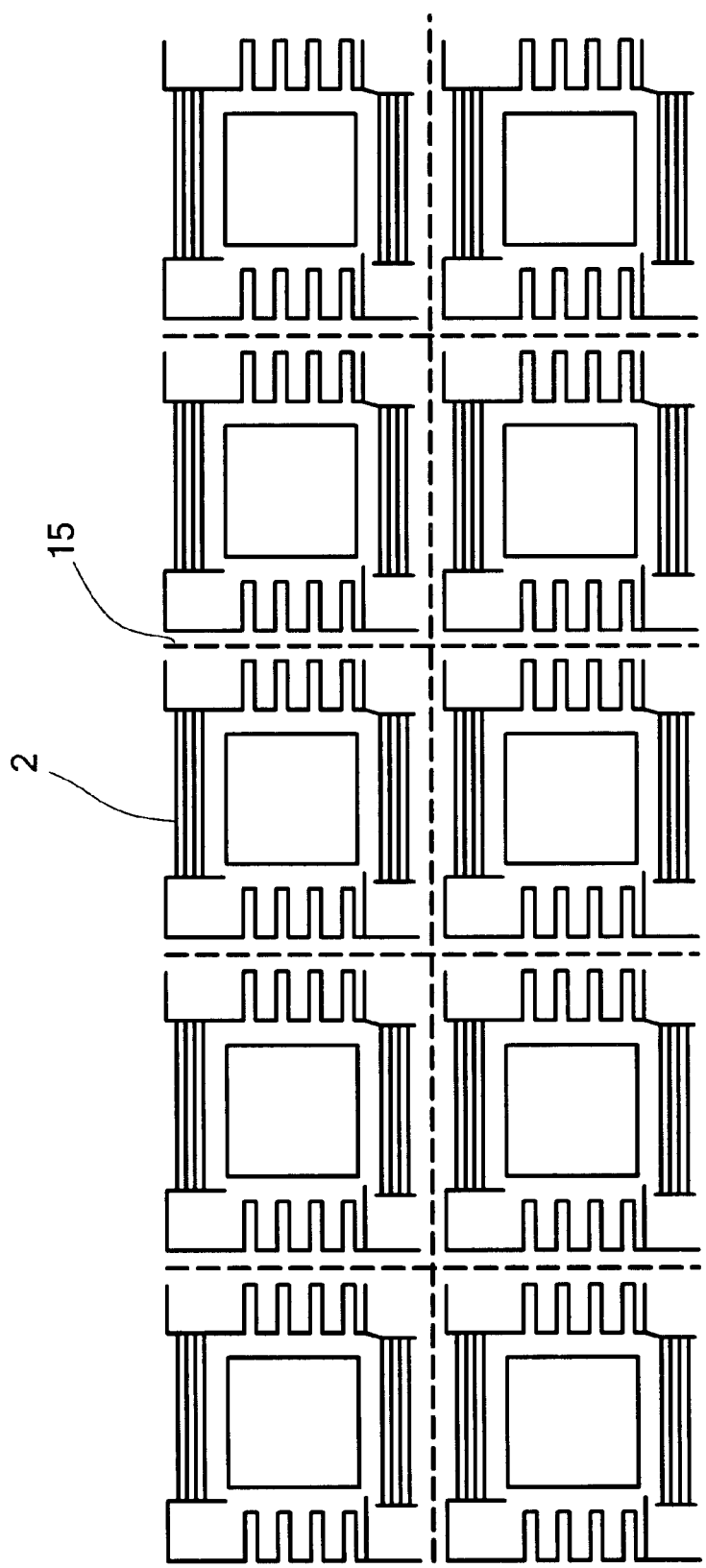
FIG. 2 shows a method for sawing moulded leadframe package according to prior art practice.

Referring now to FIG. 2 showing a method for sawing moulded leadframe package according to prior art practice, the MLP sawing operation includes attaching the MLP (2) to a carrier, mechanically, adhesively or otherwise as known in the art, and mounting the carrier on a table of the MLP saw.

A dicing blade of the MLP saw is passed through the surface of the MLP (2), either by moving the dicing blade relative to the MLP (2), the table of the MLP saw and the MLP (2) relative to a stationary dicing blade, or a combination of both. To dice the MLP (2), the dicing blade cuts precisely along each street (15), returning back over (but not in contact with) the MLP while the MLP is laterally indexed to the next cutting location. Once all cuts associated with mutually parallel streets having one orientation are complete, either the blade is rotated 90° relative to the MLP (2) or the MLP (2) is rotated 90°, and cuts are made through streets in a direction perpendicular to the initial direction of cut. Since each integrated circuit on the MLP (2) has the same size and rectangular configuration, each pass of the dicing blade is incrementally indexed one unit (a unit being equal to the distance from one street to the next) in a particular orientation of the MLP (2). As such, the dicing blade and the software controlling it are designed to provide uniform and precise indexing in fixed increments across the surface of the MLP (2).

Figure 3:
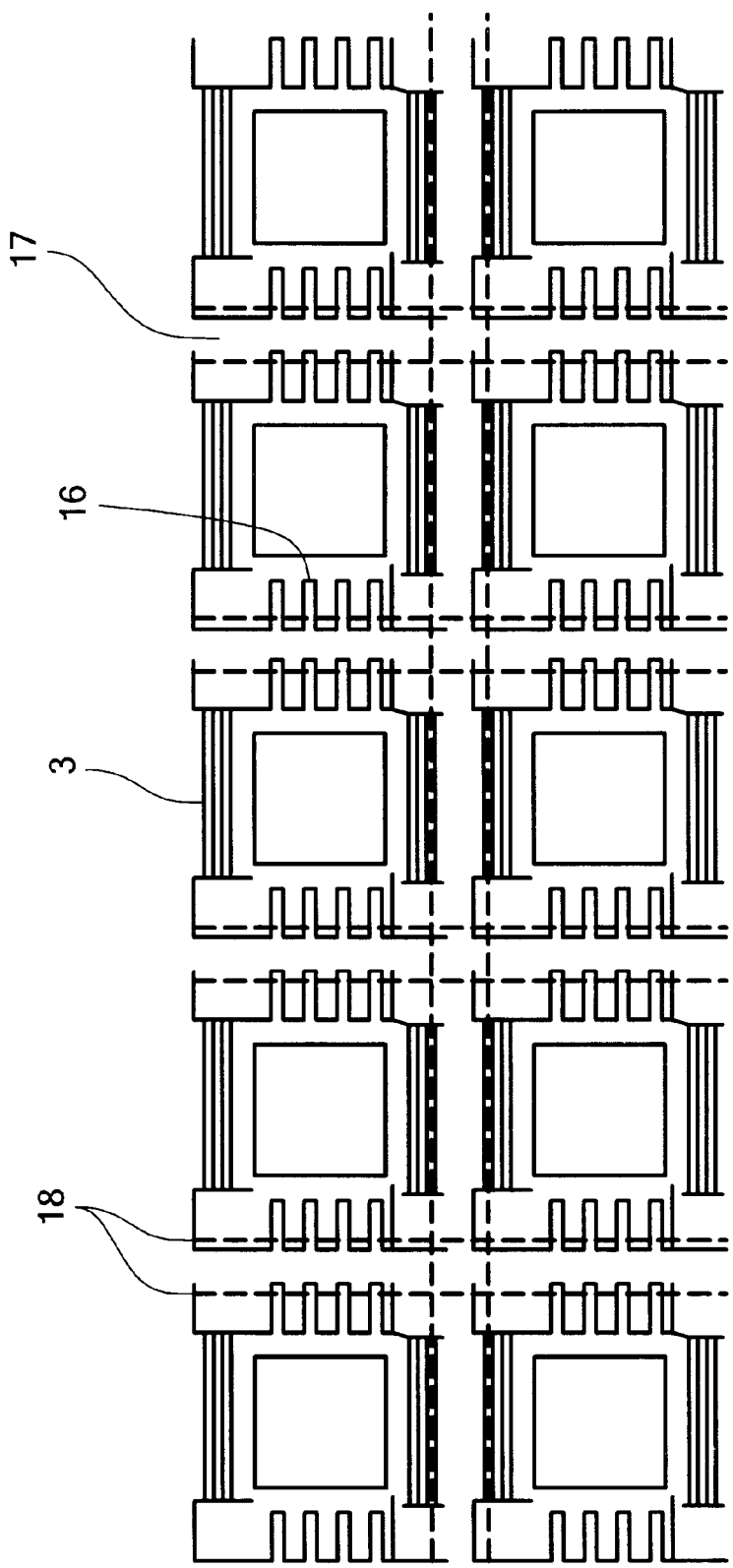
FIG. 3 shows a method for sawing moulded leadframe package according to the present invention.

Referring now to FIG. 3 showing a method for sawing the moulded leadframe package according to the present invention, the method of the present invention generally follows the steps taken in the prior art practice. Where it differs from the prior art practice is the cutting location or the street. Conventionally, the street is located along the connecting bar (17) of the MLP (3). It was found through practice that cutting along the connecting bar (17) generates a lot of heat that may cause damage; solder melts and leads (16) delamination are rampant. It is therefore suggested that the street (18) be moved onto the leads that have less surface area thus reducing significantly the heat generated during cutting. While at first this modification may look trivial, however, field-testing has proven that this invention has generous and unexpected advantages over prior practice. Even though cutting work involved in the present invention is doubled compared to prior practice, because of less heat generated the cutting speed can be increased from 10 mm/sec to 50 mm/sec. The life of the dicing blade is observed to increase by at least 50%. Apart from the above, problems found in the prior practice are not seen in the present invention.

While the preferred embodiment of the present invention and their advantages have been disclosed in the above Detailed Description, the invention is not limited thereto but only by the spirit and scope of the appended claims.

What is claimed is:

1. A method for sawing a moulded leadframe package into individual integrated circuit units, the integrated circuit units being arranged in sets, each of said integrated circuit units having a die-attach pad and a plurality of leads, and the leads of adjacent sets of integrated circuit units being joined by corresponding connecting bars, said method comprising:

attaching said moulded leadframe package to a carrier;

mounting said carrier on a table of a dicing saw; and sawing said moulded leadframe package along a plurality of streets, characterized by adjacent pairs of said streets being located on said plurality of leads between corresponding adjacent sets of integrated circuit units, and the streets of each pair being located on respective sides of the corresponding connecting bar.

* * * * *